United States Patent [19]

Heimanson et al.

[11] Patent Number: 5,950,723
[45] Date of Patent: Sep. 14, 1999

[54] METHOD OF REGULATING SUBSTRATE TEMPERATURE IN A LOW PRESSURE ENVIRONMENT

[75] Inventors: Dorian Heimanson; Thomas R. Omstead, both of Rochester, N.Y.

[73] Assignee: CVC Products, Inc., Rochester, N.Y.

[21] Appl. No.: 08/970,606

[22] Filed: Nov. 14, 1997

Related U.S. Application Data

[62] Division of application No. 08/560,344, Nov. 17, 1995, Pat. No. 5,775,416.

[51] Int. Cl.$^6$ ........................................................ F25B 29/00
[52] U.S. Cl. ........................ 165/275; 165/80.1; 165/80.2; 165/80.4; 156/345; 118/725; 204/298.09
[58] Field of Search .................................. 165/275, 80.1, 165/80.2, 80.4; 204/298.09; 118/725; 156/345

[56] References Cited

U.S. PATENT DOCUMENTS

| | | |
|---|---|---|
| 3,623,712 | 11/1971 | McNeilly et al. . |
| 3,836,751 | 9/1974 | Anderson . |
| 4,350,537 | 9/1982 | Young et al. . |
| 4,486,652 | 12/1984 | Muka et al. . |
| 4,492,852 | 1/1985 | Finegan et al. . |
| 4,493,977 | 1/1985 | Arai et al. . |
| 4,550,245 | 10/1985 | Arai et al. . |
| 4,560,420 | 12/1985 | Lord . |
| 4,680,061 | 7/1987 | Lamont, Jr. . |
| 4,743,570 | 5/1988 | Lamont, Jr. . |
| 4,857,704 | 8/1989 | Jannot et al. . |
| 4,909,314 | 3/1990 | Lamont, Jr. . |
| 4,949,783 | 8/1990 | Lakios et al. . |
| 4,971,653 | 11/1990 | Powell et al. ............................ 156/345 |
| 5,044,943 | 9/1991 | Bowman et al. . |
| 5,177,878 | 1/1993 | Visser ......................................... 34/92 |
| 5,248,402 | 9/1993 | Ballentine et al. . |
| 5,294,778 | 3/1994 | Carman et al. .......................... 118/725 |
| 5,320,982 | 6/1994 | Tsubone et al. ........................ 156/345 |
| 5,382,311 | 1/1995 | Ishikawa et al. ....................... 156/345 |
| 5,567,267 | 10/1996 | Kazama et al. ......................... 156/345 |
| 5,676,205 | 10/1997 | White ..................................... 165/275 |

FOREIGN PATENT DOCUMENTS

| 0184330 | 7/1988 | Japan ..................................... 219/445 |
|---|---|---|

*Primary Examiner*—John K. Ford
*Attorney, Agent, or Firm*—Eugene Stephens & Associates

[57] ABSTRACT

A temperature controlled chuck (20) includes a heating unit (24) and a cooling unit (34). A first cavity (30) separates the heating unit (24) from a wafer substrate (18), and a second cavity (50) separates the cooling unit (34) from the heating unit (24). A first fluid delivery system (60) conducts fluid to the first cavity (30) to facilitate exchanges of heat between the heating unit (24) and the substrate (18). A second fluid delivery system (70) conducts fluid to the second cavity (50) to facilitate exchanges of heat between the heating unit (24) and the cooling unit (34). A control system (90) raises the temperature of the substrate (18) by increasing power to the heating unit (24) and by evacuating fluid from the second cavity (50) and lowers the temperature of the substrate (18) by reducing power to the heating unit (24) and by conducting fluid to the second cavity (50).

7 Claims, 4 Drawing Sheets

METHOD OF REGULATING SUBSTRATE TEMPERATURE IN A LOW PRESSURE ENVIRONMENT

RELATED APPLICATIONS

This application is a Division of copending parent application Ser. No. 08/560,344, filed Nov. 17, 1995, and entitled TEMPERATURE CONTROLLED CHUCK FOR VACUUM PROCESSING.

TECHNICAL FIELD

The invention relates to vacuum processing substrates, including microelectronic or optical components, and to temperature control of such substrates in evacuated environments.

BACKGROUND

Vacuum processing operations on substrates, such as deposition of thin films, often require control over substrate temperature. Deposition operations include sputtering, evaporation, and chemical vapor deposition. Related operations such as cleaning, planarizing, annealing, and etching can also require substrate temperature controls.

Some operations require the addition of heat, and others require excess heat to be removed. Also, certain combinations of operations require both heating and cooling in various orders. Heating can be accomplished with radiant heaters that focus heat energy on substrate surfaces. Cooling is often accomplished by removing the substrates from the evacuated environment. However, with these limited controls, constant substrate temperatures are difficult to maintain and temperature transitions can be time consuming.

Better control over substrate temperature has been achieved by transferring heat through substrate supports or chucks. Ordinarily, conduction in a vacuum environment between the substrate and its support is highly inefficient. However, more efficient transfers of heat are possible by filling gaps between the substrate and its support with a gas that is compatible with the vacuum processing environment.

For example, U.S. Pat. No. 4,909,314 to Lamont, Jr. discloses a substrate support that also functions as a temperature conditioner such as a heating unit or a cooling unit. The substrate is clamped to the support, and a cavity between the substrate and the support is filled with a gas such as argon. The gas, which is maintained at a pressure above that of the vacuum processing environment but well below atmospheric pressure, transfers heat by convection between the substrate and substrate support.

U.S. Pat. No. 4,949,783 to Lakios et al. discloses a similar substrate support arranged as a cooling unit. However, instead of merely conducting gas into a cavity between the substrate and its support, the gas is circulated into and out of the cavity to carry away excess heat. The cooling unit has additional areas exposed to the circulating gas to extract the heat from the gas.

Although the known substrate supports can be arranged to operate effectively as either heating units or cooling units, some combinations of vacuum processing operations require both heating and cooling to achieve desired temperature patterns. Substrate supports arranged for heating are slow to cool, and substrate supports arranged for cooling provide no means for heating. Thus, controlled variations in substrate temperatures are limited to either increases or decreases in temperature, and constant substrate temperatures are difficult to maintain in processing environments that also involve transfers of heat.

SUMMARY OF INVENTION

Our invention provides improved temperature control over substrates processed in evacuated environments. Substrate temperatures can be maintained more accurately to improve processing quality, and temperature changes can be made more rapidly to shorten processing times.

One example includes the known features of a first temperature conditioner that supports a substrate in an evacuated environment, a first cavity between the first temperature conditioner and the substrate, and a first delivery system that conducts a fluid to the cavity for exchanging heat between the first temperature condition and the substrate. However, our invention also includes a second temperature, conditioner, a second cavity located between the two conditioners, and a second delivery system that conducts fluid to the second cavity for facilitating exchanges of heat between the two conditioners.

A control system regulates flows of fluid into and out of the second cavity to regulate the heat exchanges between conditioners. The heat exchanges are facilitated by the presence of fluid in the second cavity and inhibited by the absence of the fluid. Preferably, the first temperature conditioner is a heating unit and the second temperature conditioner is a cooling unit.

The temperature of the substrate is raised by increasing an amount of heat produced by the heating unit and by evacuating a fluid from the second cavity. The temperature of the substrate is lowered by reducing the amount of heat produced by the heating unit and by conducting the fluid to the second cavity. The cooling unit, which requires no special controls, extracts excess heat from the heating unit through the fluid in the second cavity. This significantly reduces the amount of time required to lower substrate temperature and permits the substrate to remain within the same evacuated environment for more continuous processing. The control system can also make smaller changes in fluid pressure in the second cavity, even while heating, to more closely control the substrate temperature.

The first cavity is located within the evacuated environment, but the second cavity is isolated from that environment by the first temperature conditioner. Thus, the delivery of fluid to the first cavity is required to support efficient thermal exchanges between the first temperature conditioner and the substrate, but close contact alone could have been used to provide efficient heat exchanges between the first and second temperature conditioners. Instead, our invention provides for separating the two conditioners by an independently evacuatable space (i.e., the second cavity) to inhibit as well as facilitate the heat exchanges by varying the fluid pressure.

DRAWINGS

DETAILED DESCRIPTION

Figure 1:
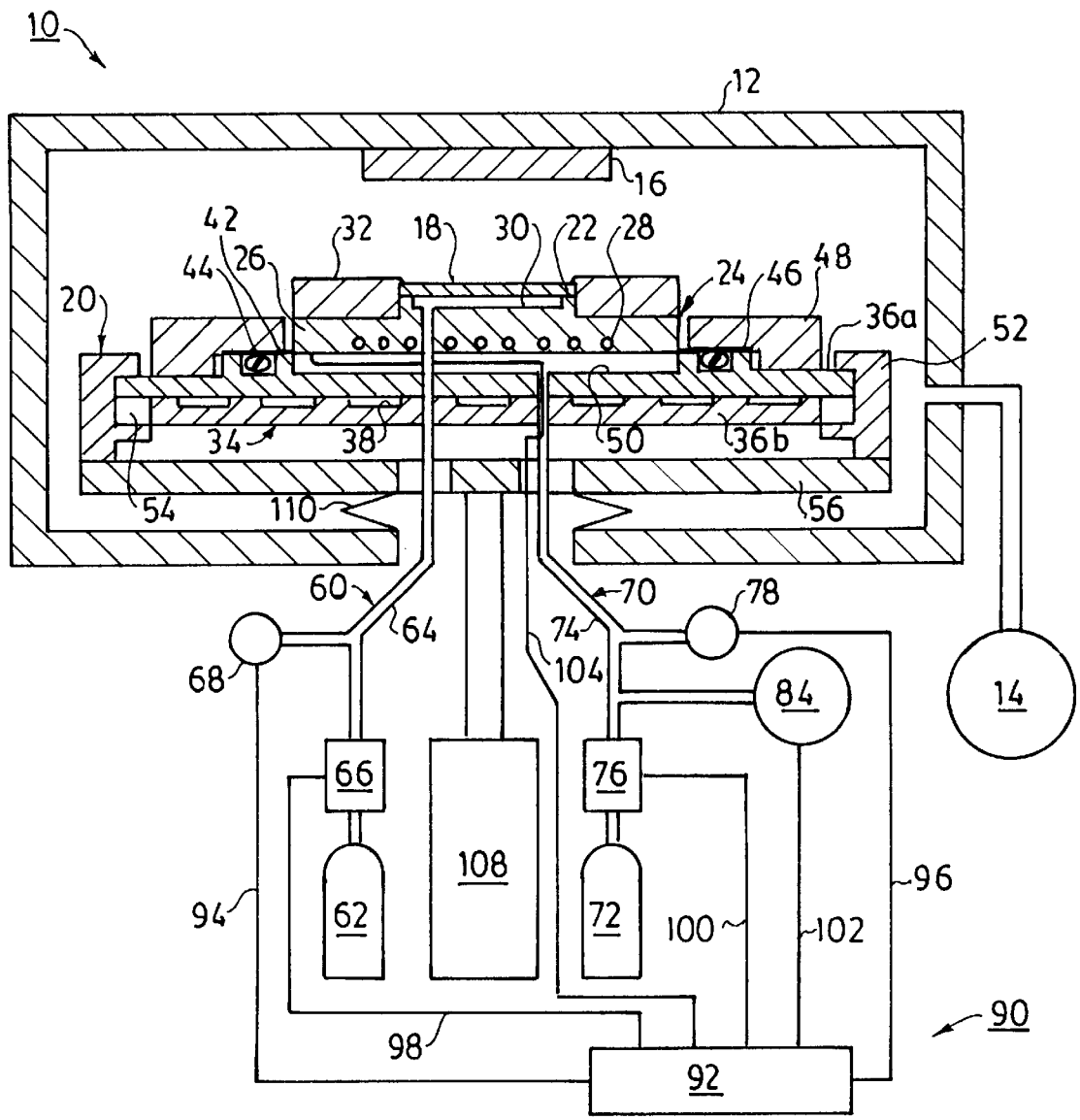
FIG. 1 is a schematic layout in side cross section of a sputter deposition system including our new temperature controlled chuck.

A sputter deposition system 10 incorporating our invention is depicted in FIG. 1. The system 10 includes the usual features of a vacuum chamber 12, which is evacuated by a pump 14, and a target 16 of material to be deposited on a wafer substrate 18. An electrical potential is applied to the target 16 in the presence of an ionizable gas, causing gas ions to strike the target 16 and release atoms of the target material into a plasma that deposits the target material on the wafer substrate 18.

The plasma can be controlled by magnets (not shown) located in the vicinity of the target 16 or the wafer substrate 18. For example, coassigned U.S. Pat. No. 5,248,402 discloses an apple-shaped magnetron mounted in the vicinity of a target for more evenly eroding the target, and coassigned U.S. application Ser. No. 08/369,381 discloses a magnetic orienting device in the vicinity of a wafer substrate for magnetically orienting the deposited target material. Both references are hereby incorporated by reference. Further details of sputtering systems are found in these references. The invention, however, is also applicable to other vacuum processing operations including evaporation, chemical vapor deposition, planarizing, annealing, etching, and cleaning.

Figure 2:
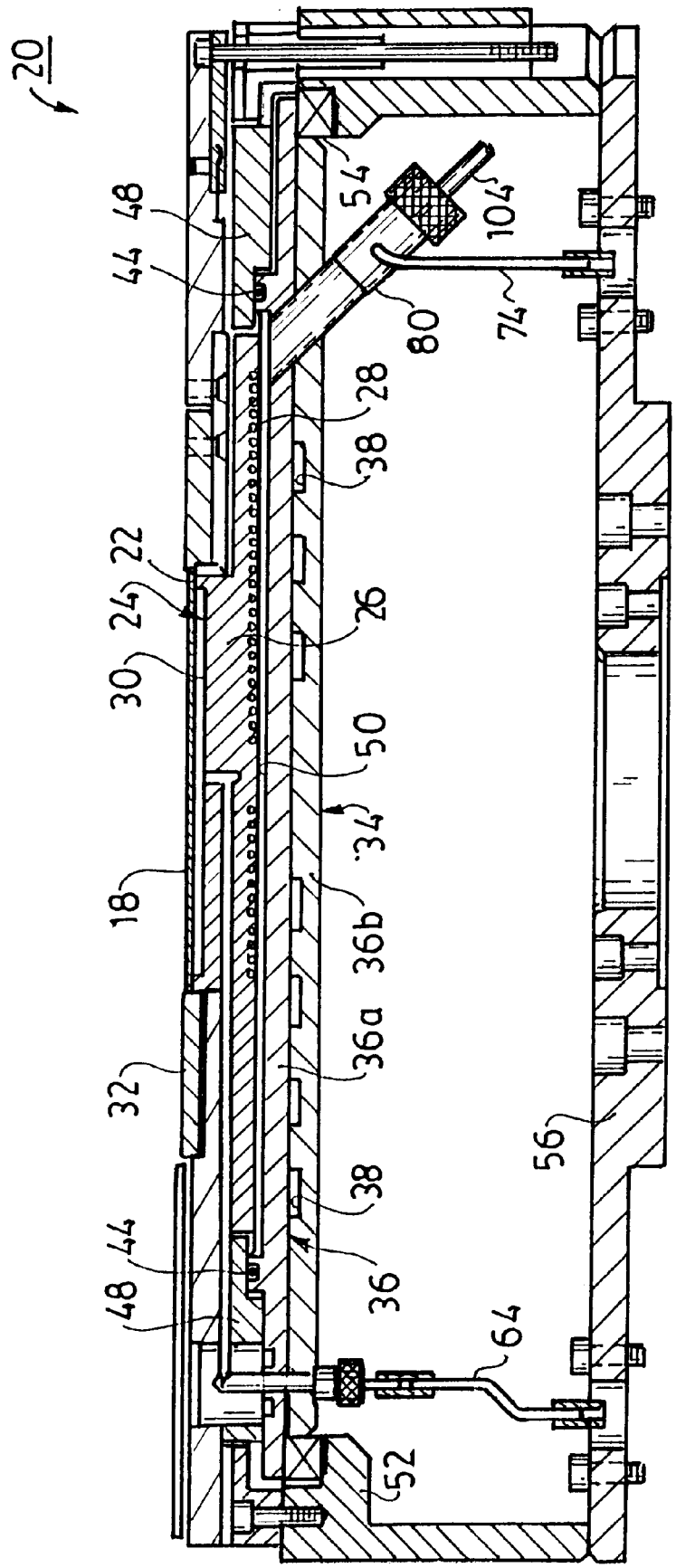
FIG. 2 is a more detailed side cross-sectional view of the temperature controlled chuck.

A new substrate support, namely chuck 20, for use in such vacuum processing operations is shown also in FIG. 2 in a less schematic format. The wafer 18 mounts on an annular seat 22 of a heating unit 24, which is preferably made with a stainless steel body 26 (such as INCONEL) supporting a heating element 28 made of an iron-aluminum-chromium alloy (such as KANTHAL) for heating wafers up to 1000 degrees Centigrade. The annular seat 22 forms, together with the wafer 18 and the heating unit body 26, a first cavity 30. An annular clamp 32 secures the wafer 18 to the seat 22.

Figure 3:
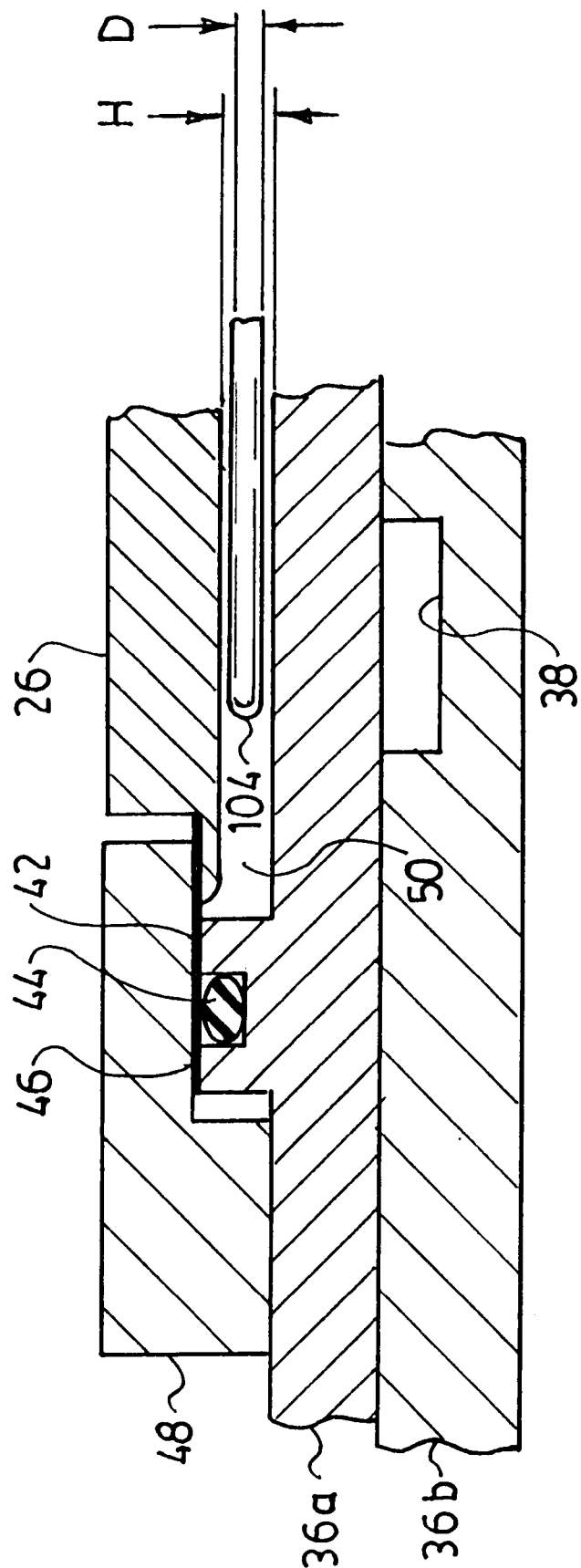
FIG. 3 is an enlarged fragmentary view of a portion of FIG. 2 showing a seal between two temperature conditioners.

A cooling unit 34, which is preferably made with a stainless steel body 36 containing coolant passageways 38, is positioned adjacent to the heating unit 24. As best seen in FIG. 3, the stainless steel body 36 is made from two plates 36a and 36b. The passageways 38 are formed as channels in the plate 36b and are covered by the plate 36a.

An annular rim 42 of the heating unit 24 engages an O-ring seal 44 mounted in an annular seat 46 of the cooling unit 34. An annular clamp 48 urges the annular rim 42 toward the annular seat 46 for compressing the O-ring seal 44. The O-ring seal 44 is preferably made from perfluoroelastomer (such as KALREZ) to withstand elevated temperatures. The annular rim 42 is made as thin as possible to limit conduction of heat to the O-ring seal 44. On the other hand, the annular clamp 48, which is preferably made from copper, is made much thicker to conduct heat from the annular rim 42 to the cooling unit 34.

The O-ring seal 44 and annular seat 46, together with the respective bodies 26 and 36 of the heating and cooling units 24 and 34, form a second cavity 50, which is evacuatable independently of the first cavity 30 and the vacuum chamber 12. Another annular clamp 52 and annular seal 54, shown in FIGS. 1 and 2, secure the body 36 of the cooling unit 34 to a body 56 of the chuck 20. The seal 44 isolates the second cavity 50 from the evacuatable space of the vacuum chamber 12, and the seal 54 separates the vacuum chamber 12 from ambient atmospheric conditions within the chuck 20.

Separate delivery systems 60 and 70 convey fluids to the first and second cavities 30 and 50. The delivery system 60 includes a tank 62 or other source of compressed gas, such as argon, which is compatible with the processing operations within the vacuum chamber 12. A conduit 64 conveys the gas through the chuck body 56, the cooling unit body 36, and the heating unit body 26 into the first cavity 30. Along the conduit 64, a flow control valve 66 limits the flow of gas to the first cavity 30, and a vacuum gauge 68 monitors pressure in the first cavity 30.

The delivery system 70 also includes a tank 72 or other source of compressed gas. However, since the second cavity 50 is isolated from the vacuum chamber 12, a wider variety of gases can be used including gases exhibiting better convection qualities such as helium, hydrogen, and nitrogen. A conduit 74 conveys the gas through the chuck body 58 and into a fitting 80 that extends through the cooling unit body 36 into the second cavity 50. Flows from the tank 62 to the second cavity 50 are limited by flow control valve 76. A vacuum gauge 78 monitors pressure in the second cavity. In addition, a vacuum pump 84 is connected to the conduit 74 for evacuating fluid from the second cavity 50.

A control system 90 includes a processor 92 with inputs 94 and 96 from the two vacuum gauges 68 and 78 and outputs 98, 100, and 102 to the two flow control valves 66 and 76 and the vacuum pump 84 for regulating fluid pressure in the first and second cavities 30 and 50. The first cavity 30 is evacuated together with the vacuum chamber 12. A desired fluid pressure is maintained in the first cavity 50 by conducting fluid to the cavity 30 at a rate that compensates for any leakage between the annular seat 22 of the heating unit 24 and the wafer substrate 18. The vacuum pump 84 is controlled in conjunction with flow control valve 76 for regulating fluid pressure in the second cavity 50.

The heating unit 24 is controlled by lead wires 104 that extend through the fitting 80 into the second cavity 50, where they are curled in a horizontal plane to accommodate expansion and contraction of the heating element 28. Referring again to FIG. 3, the second cavity 50 has a height "H" that is at least equal to a diameter "D" of the lead wires 104 to provide the necessary space for curling the lead wires 104. Preferably, the height "H" is at least 2 millimeters.

The temperature of the wafer 18 can be approximated by monitoring the temperature of the heating unit body 26 and by calculating an approximate temperature offset of the wafer 18 based on predetermined rates of energy transfer between the heating unit 24 and the wafer 18. The wafer temperature could also be monitored directly within the vacuum chamber 12, such as by using an optical sensor (not shown) to detect levels of radiated heat.

The chuck 20 is supported on a vertical drive 108 for raising and lowering the wafer substrate 18 within the vacuum chamber. Bellows 110 seal the chuck body 56 to the vacuum clamber 12 while permitting the relative vertical movement of the chuck 20. Preferably, a plurality of bellows (not shown) provides separate exits from the vacuum chamber 12 for the conduits 64 and 74.

During both heating and cooling, the flow control valve 66 preferably maintains a predetermined pressure (e.g., 5 to 20 Torr) in the first cavity 30 sufficient to provide thermal communication between the heating unit 25 and the wafer substrate 18 and coolant is preferably circulated through the coolant passages 38 of the cooling unit 34. During heating, power is supplied to the heating unit 24 and the vacuum pump 84 evacuates fluid from the second cavity 50 to inhibit transfers of heat from the heating unit 24 to the cooling unit 34. During cooling, the power supplied to the heating unit 24 is reduced (or terminated) and the flow control valve 76 maintains fluid pressure (e.g. 10 to 50 Torr or more) in the second cavity 50 sufficient to promote transfer of heat from the heating unit 24 to the cooling unit 34.

The wafer substrate 18 can be maintained at a more stable elevated temperature by slightly overpowering the heating unit 24 (i.e., by producing excess heat) and by maintaining fluid pressure in the second cavity 50 to remove the excess heat. The wafer temperature can be slightly raised (e.g., 10 degrees Centigrade) by lowering fluid pressure in the second cavity 50 and slightly lowered (e.g., 10 degrees Centigrade) by raising the fluid pressure in the second cavity 50. This provides faster and more accurate control over wafer temperatures.

Figure 4:
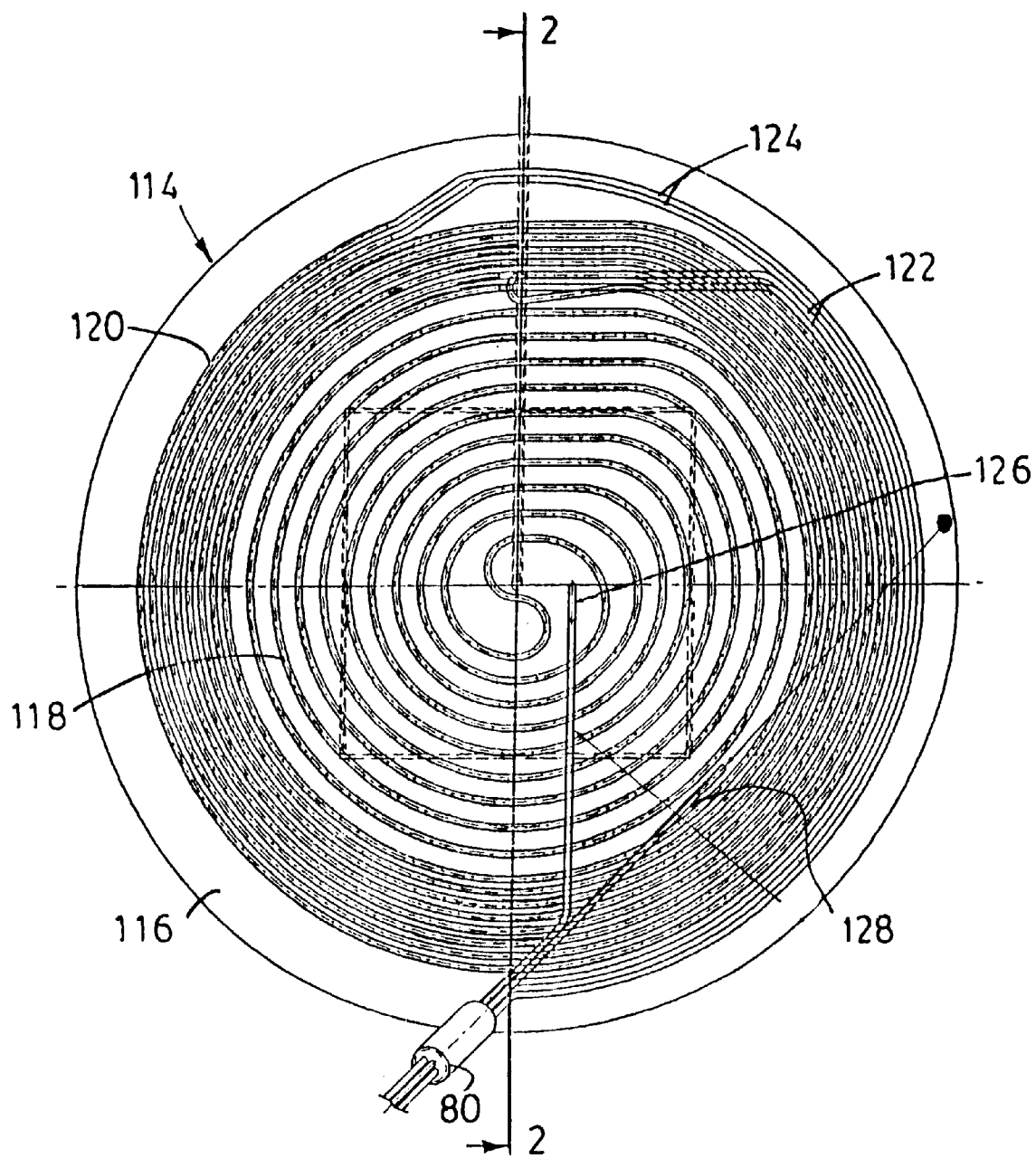
FIG. 4 is a more detailed bottom view of a two-zone heating unit that can be used as one of the temperature conditioners.

An alternative two-zone heating unit 114 is shown in FIG. 4 as it would appear when viewed from the second cavity 50. The heating unit 114 has a thermally conductive body 116 supporting inner and outer heating elements 118 and 120. The inner heating element 118 is powered through lead wires 122, and the outer heating element 120 is powered through lead wires 124. Two thermocouples 126 and 128 monitor temperatures at different radial positions in the conductive body 116. The two thermocouples 126 and 128 and the lead wires 122 and 124 emerge from the second cavity 50 through the lifting 80 similar to the lead wires 104 of the heating unit 24.

The two-zone heating unit 114 can be used together with the cooling unit 34 to compensate for radial temperature variations in the wafer substrate 18. For example, heat is often dissipated mole rapidly from a periphery of the wafer 18 than from its center. To compensate for this radial temperature variation, more power can be applied to the outer heating element 120 than to the inner heating element 118. However, conductivity tends to diminish the radial temperature gradient in the heating unit body 116, so zone control of the heating unit 114 alone may not be sufficient to maintain a uniform temperature distribution throughout the wafer substrate 18.

According to our invention, fluid pressure in the second cavity 50 can be controlled to conduct heat from the heating unit body 116, requiring one or more of the heating elements 118 and 120 to be over powered to maintain the desired overall temperature of the wafer substrate 18. Increasing the fluid pressure in the second cavity 50 tends to sustain temperature gradients in the heating unit body 116 induced by different zonal heating, and decreasing the fluid pressure in the second cavity 50 tends to diminish this effect. Thus, control over both the fluid pressure in the second cavity 50 and the power to the different heating elements 118 and 120 provides for controlling both the overall temperature of the wafer substrate 18 and the temperature distribution throughout the wafer substrate 18.

More or differently shaped heating zones could be used to affect other temperature distributions in the wafer substrate 18. The second cavity 50 could also be divided into independently controllable zones (not shown) for further influencing temperature gradients. The cooling unit 34 could also be controlled such as by regulating the flow or temperature of the circulating coolant. These and many other changes or enhancements will be apparent to those of skill in art in accordance with the overall teachings of this invention.

We claim:

1. A method of maintaining a substrate at a uniformly elevated temperature in an evacuated processing environment comprising the steps of:

mounting the substrate on a conductive body within a vacuum chamber in thermal communication with a heating unit that is divided into a plurality of separately controlled heating elements;

exposing the substrate to processing resulting in a more rapid dissipation of heat from one part of the substrate than another;

conducting a flow of fluid into an evacuatable cavity separating the heating unit from a cooling unit for withdrawing some of heat generated by the heating unit;

controlling both fluid pressure in the cavity and power applied to two of the separately controlled heating elements to sustain an overall elevated temperature of the substrate; and overpowering one of the heating elements while increasing fluid pressure in the cavity to sustain a more uniform temperature distribution throughout the substrate than would be possible at a lower fluid pressure in the cavity without raising the overall temperature of the substrate.

2. The method of claim 1 in which said step of controlling includes adjusting the fluid pressure over a continuum of pressures for sustaining the overall temperature of the substrate.

3. The method of claim 1 in which heat dissipates more rapidly from a periphery than a center of the substrate, the heating elements include inner and outer heating elements, and said step of overpowering includes overpowering the outer heating element.

4. The method of claim 1 in which said step of controlling includes supplying different amounts of power to the heating elements.

5. The method of claim 1 in which said step of controlling fluid pressure includes raising fluid pressure to reduce the overall substrate temperature.

6. The method of claim 1 in which said step of controlling fluid pressure includes lowering the fluid pressure to increase the overall substrate temperature.

7. The method of claim 1 including the further step of dividing the evacuatable cavity between the heating and cooling units into separately controllable zones for further influencing the temperature distributions in the substrate.

* * * * *